(12) United States Patent
Brunschwiler et al.

(10) Patent No.: US 10,068,839 B2
(45) Date of Patent: Sep. 4, 2018

(54) CIRCUITIZED SUBSTRATE WITH ELECTRONIC COMPONENTS MOUNTED ON TRANSVERSAL PORTION THEREOF

(71) Applicant: INTERNATIONAL BUSINESS MACHINES CORPORATION, Armonk, NY (US)

(72) Inventors: Thomas J. Brunschwiler, Thalwil (CH); Sebastian Gerke, Klingnau (CH); Stefano Sergio Oggioni, Besana in Brianza (IT)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 14 days.

(21) Appl. No.: 15/342,619

(22) Filed: Nov. 3, 2016

(65) Prior Publication Data
US 2018/0005934 A1    Jan. 4, 2018

(30) Foreign Application Priority Data
Jun. 30, 2016  (IT) .................. 102016000068268

(51) Int. Cl.
*H01L 23/498*    (2006.01)
*H01L 23/04*    (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC . H01L 23/49838; H01L 24/81; H01L 21/486; H01L 21/4857; H01L 24/17;
(Continued)

(56) References Cited

U.S. PATENT DOCUMENTS 6,898,769 B2    5/2005 Nassif et al.
7,802,220 B1    9/2010 Popovich et al.
(Continued)

*Primary Examiner* — Fernando L Toledo
*Assistant Examiner* — Adam S Bowen
(74) *Attorney, Agent, or Firm* — Tihon Poltavets; Blanche E. Schiller, Esq.; Heslin Rothenberg Farley & Mesiti P.C.

(57) ABSTRACT

A circuitized substrate for mounting at least one electronic component having a plurality of terminals. The circuitized substrate includes a first portion of electrical insulating material embedding a first electric circuit for coupling a first subset of the terminals. The first electric circuit including one or more patterned conductive layers of electrically conductive material extending parallel to a plane of the circuitized substrate. The circuitized substrate further includes a second portion of electrically conductive material. One or more insulating elements of electrical insulating material cross the second portion transversally to the plane to insulate a plurality of conductive elements thereof for coupling a second subset of the terminals. One or more auxiliary components of the electronic component are mounted on the second portion. Each auxiliary component having a first terminal and a second terminal coupled with a first one and a second one, respectively, of a pair of the conductive elements.

20 Claims, 9 Drawing Sheets

(51) Int. Cl.
　　　*H01L 23/00*　　　(2006.01)
　　　*H01L 21/48*　　　(2006.01)
(52) U.S. Cl.
　　　CPC ........ *H01L 23/04* (2013.01); *H01L 23/49822* (2013.01); *H01L 23/49827* (2013.01); *H01L 24/17* (2013.01); *H01L 24/81* (2013.01); *H01L 2224/05147* (2013.01); *H01L 2224/16227* (2013.01); *H01L 2924/05442* (2013.01); *H01L 2924/10253* (2013.01); *H01L 2924/14* (2013.01); *H01L 2924/15153* (2013.01); *H01L 2924/15311* (2013.01); *H01L 2924/15747* (2013.01); *H01L 2924/19041* (2013.01); *H01L 2924/19102* (2013.01)
(58) Field of Classification Search
　　　CPC ............... H01L 23/04; H01L 23/49827; H01L 23/49822; H01L 2224/16227; H01L 2924/15311; H01L 2924/05442; H01L 2224/05147; H01L 2924/102
　　　USPC ........................................................ 257/668
　　　See application file for complete search history.

(56) References Cited

U.S. PATENT DOCUMENTS

| | | |
|---|---|---|
| 7,968,929 B2 | 6/2011 | Chinthakindi et al. |
| 8,411,399 B2 | 4/2013 | Venkatraman et al. |
| 8,946,856 B2 | 2/2015 | Pereira et al. |
| 2004/0184219 A1* | 9/2004 | Otsuka .............. H01L 23/49805 361/306.3 |

* cited by examiner

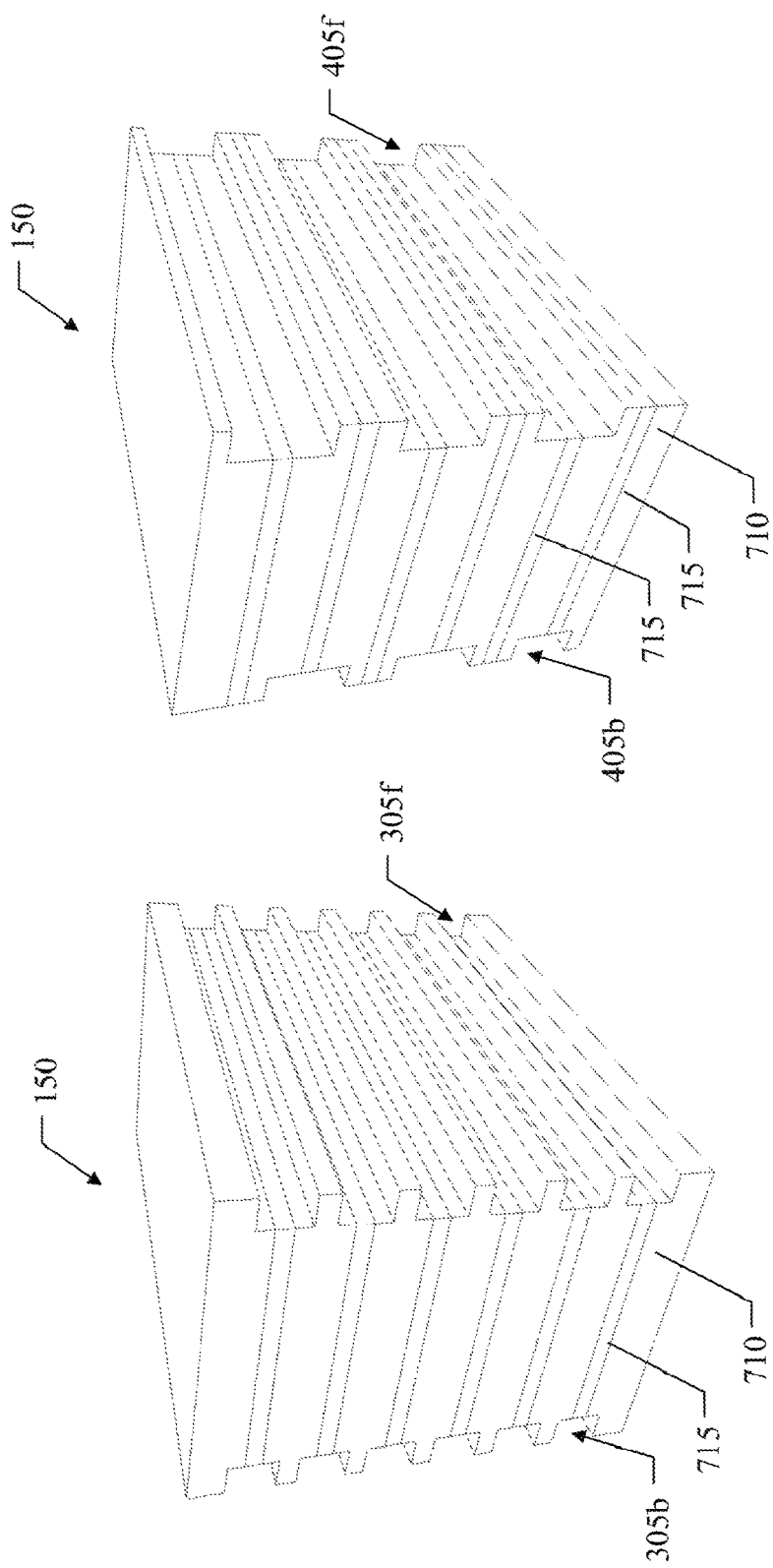

CIRCUITIZED SUBSTRATE WITH ELECTRONIC COMPONENTS MOUNTED ON TRANSVERSAL PORTION THEREOF

PRIOR FOREIGN APPLICATION

This application claims priority from Italian patent application number 102016000068268, filed Jun. 30, 2016, which is hereby incorporated herein by reference in its entirety.

BACKGROUND

The background is hereinafter introduced with the discussion of techniques relating to its context. However, even when this discussion refers to documents, acts, artifacts and the like, it does not suggest or represent that the discussed techniques are part of the prior art or are common general knowledge in the field relevant to aspects of the present disclosure.

Aspects of the present disclosure relate to the field of electronics. More specifically, aspects of the disclosure relate to circuitized substrates.

Circuitized substrates (i.e., insulating substrates supporting electric circuits) are commonly used in electronic devices to mount electronic components thereof (so as to protect them from mechanical stresses and to connect them electrically). A typical example is a chip carrier that mounts a (monolithic) chip implementing an Integrated Circuit (IC). For example, the corresponding electronic device may be of the flip-chip type, also known as Controlled Collapse Chip Connection (C4); in this case, the chip is flipped and its terminals are directly connected to facing lands of the carrier, which are generally connected to contacts (for example, balls) of the electronic device arranged on an opposite surface of the carrier by through via-holes, or simply through vias.

Operation of the integrated circuit of the chip often requires one or more auxiliary components. For example, decoupling capacitors (de-caps) are associated with supply terminals of the chip (used to provide a power supply thereto) to reduce undesired noise in the power supply. For this purpose, the (decoupling) capacitors are arranged between the supply terminals receiving a ground voltage and the supply terminals receiving a supply voltage. In this way, the capacitors may shunt (AC) signals superimposed on the (DC) power supply and fluctuations in the power supply caused by switching occurring in the integrated circuit; moreover, the capacitors may store energy to compensate short drops of the power supply due to changing current demand of the integrated circuit.

The capacitors may be integrated on the chip itself. However, special technologies are required to insulate the capacitors from the rest of the integrated circuit (for example, in deep trench structures); these special technologies increase the cost of the chip (and then of the whole electronic device) and they may not be always available. Moreover, the capacitors that may be integrated on the chip are small and then with low capacitance. In any case, this has a significant impact on the manufacturing of the chip; indeed, the integration of the capacitors on the chip requires a dedicated development thereof, with corresponding design, test and deployment.

Alternatively, the capacitors may be mounted on the carrier. However, the limited room available to mount the capacitors only allows the use of relatively small capacitors and then again with low capacitance. Moreover, the connections of the capacitors to the chip may create a bottleneck for the required current density. In any case, the relatively high distance between the chip and the capacitors degrades performance; indeed, the corresponding connections introduce a significantly high line inductance and series resistance.

In both cases, the (relatively) low capacitance that is provided may cause unacceptable variations of the power supply.

Moreover, a complete re-qualification is required for each type of chip and/or for new generations thereof.

An interposer may also be provided between the carrier and the chip to mount the capacitors. However, this significantly increases the size of the electronic device. In any case, the interposer has a detrimental effect on the cost of the electronic device.

SUMMARY

Shortcomings of the prior art are overcome and additional advantages are provided through the provision of a circuitized substrate for mounting at least one electronic component having a plurality of terminals. The circuitized substrate includes a first portion of electrical insulating material embedding a first electric circuit for coupling a first subset of terminals, the first electric circuit including one or more patterned conductive layers of electrically conductive material extending parallel to a plane of the circuitized substrate; a second portion of electrically conductive material, where one or more insulating elements of electrical insulating material cross the second portion transversally to the plane to insulate a plurality of conductive elements thereof for coupling a second subset of terminals; and one or more auxiliary components of an electronic component mounted on the second portion, an auxiliary component having a first terminal and a second terminal coupled with a first conductive element and a second conductive element, respectively, of a pair of conductive elements of the plurality of conductive elements.

Methods and devices relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

Aspects of the present disclosure, as well as further features and advantages thereof, will best be understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to illustrate the structures and procedures described herein conceptually. Particularly:

FIG. 7A-FIG. 7D show phases of a process for manufacturing the supply insert according to an embodiment of the present disclosure.

DETAILED DESCRIPTION

Figure 1:
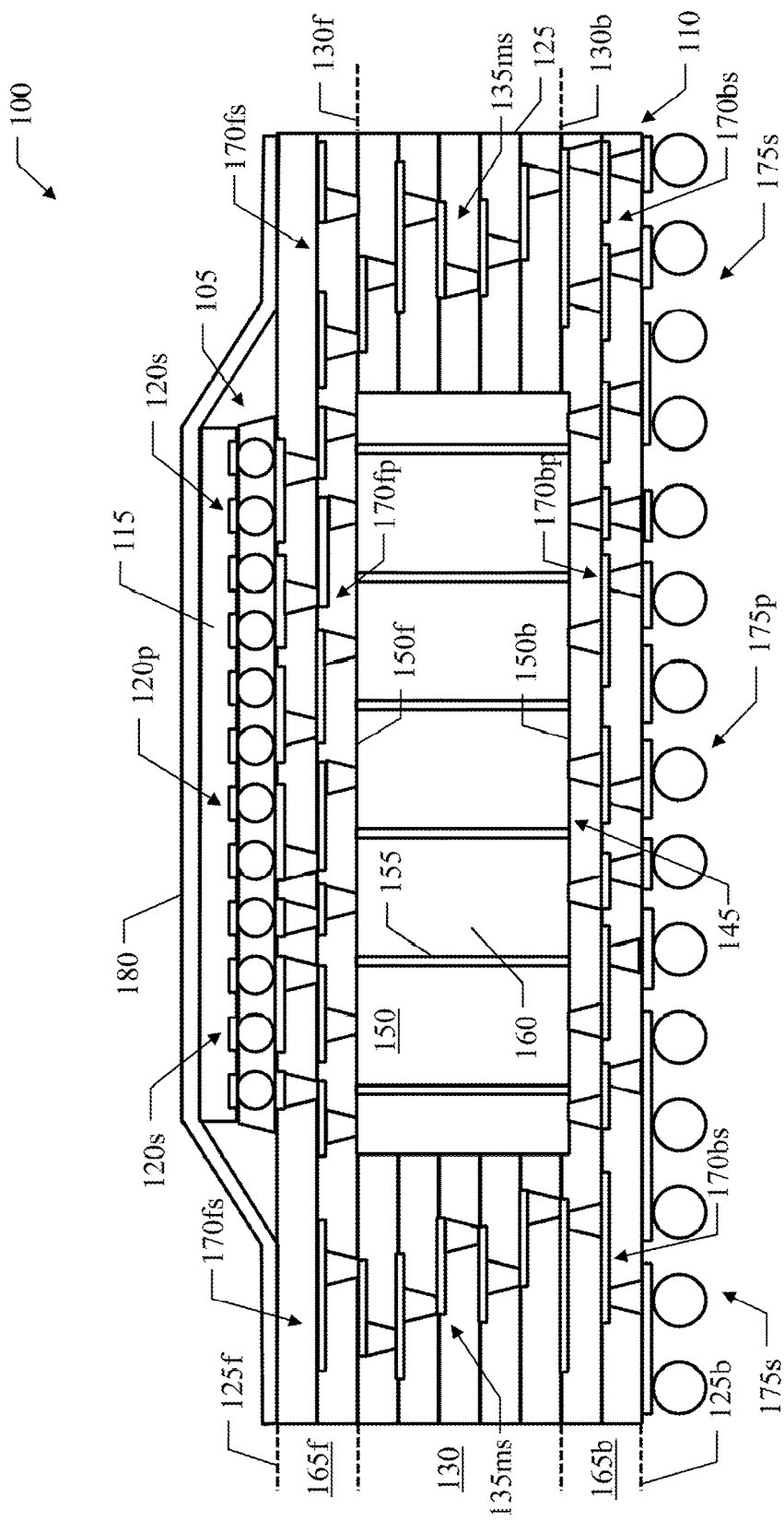
FIG. 1 shows a schematic representation in cross-sectional side view of an electronic device wherein an aspect according to an embodiment of the present disclosure may be applied.

With reference to FIG. 1, a schematic representation in cross-sectional side view is shown of an electronic device 100 wherein an aspect according to an embodiment of the present disclosure may be applied.

In one example, the electronic device 100 is of the flip-chip type, wherein a chip 105 is flipped and then directly connected to a (chip) carrier 110.

The chip 105 comprises a die 115 of semiconductor material (for example, silicon), whereon a circuit implementing an electronic component (for example, a microprocessor) is integrated. Terminals of electrically conductive material (for example, pads of copper) are exposed on a (front) surface of the die 115 (typically covered with a protective layer of electrically insulating material, such as silicon oxide). The terminals are used to access the integrated circuit of the chip 105; e.g., some (signal) terminals, denoted with reference 120s, are used to exchange signals (i.e., input/output electrical quantities processed by the integrated circuit according to its function) and some (supply) terminals, denoted with reference 120p, are used to receive a power supply of the chip 105 (i.e., a reference voltage, or ground, and a supply voltage with reference thereto). Generally, the terminals 120s, 120p are arranged in a grid (for example, with up to some thousands of terminals 120s, 120p arranged in rows and columns); the supply terminals 120p (for example, more than a half of all the terminals) are more densely concentrated in a central portion of the grid, organized in corresponding (partial) rows for receiving the ground voltage and the supply voltage alternately.

The carrier 110 comprises a circuitized substrate 125; the circuitized substrate 125 extends between a front surface 125f and a back surface 125b opposite to each other, which define the orientation of a main plane of the circuitized substrate 125 (parallel thereto).

The circuitized substrate 125 has a main portion 130 of electrically insulating material (for example, epoxy resin), which provides the mechanical characteristics of the circuitized substrate 125; the main portion 130 extends between an end surface 130f and an end surface 130b, parallel to the main plane of the circuitized substrate 125. The main portion 130 embeds a signal (electric) circuit 135ms. The signal circuit 135ms comprises one or more conductive layers of electrically conductive material (for example, copper), which extend parallel to the main plane of the circuitized substrate 125 (for example, with a sandwiched structure formed by a rigid core and alternated conductive layers and insulating layers); the conductive layers are patterned into traces, with the traces in the different conductive layers that are connected among them by through-vias (crossing the insulating layers).

A through-hole 145 crosses the main portion 130 from the end surface 130f to the end surface 130b; the through hole 145 is formed in a central area of the circuitized substrate 125, in the shadow region (under the chip 105) encompassing the core shadow region (under the supply terminals 120p). A supply module 150 of electrically conductive material (for example, copper) is inserted in the through hole 145; the supply module 150 extends between a front surface 150f and a back surface 150b that are flush with the end surface 130f and the end surface 130b, respectively, of the main portion 130. One or more insulating elements 155 of electrically insulating material (for example, epoxy resin) cross the supply insert 150, transversally to the main plane of the circuitized substrate 125. The insulating elements 155 insulate a plurality of conductive elements 160 of the supply module 150, which extend transversally to the main plane of the circuitized substrate 125 as well (for example, along the rows of the supply terminals 120p), so as to obtain a sandwiched structure (in vertical) formed by alternated insulating elements 155 and conductive elements 160.

The circuitized substrate 125 further has a (front) external portion 165f of electrically insulating material, which covers the end surface 130f and the supply module 150 (above) to define the front surface 125f, and a (back) external portion 165b of electrically insulating material, which covers the end surface 130b and the supply module 150 (below) to define the back surface 125b (for example, both of the same material of the main portion 130). The external portion 165f and the external portion 165b embed a (front) signal (electric) circuit 170fs and a (back) signal (electric) circuit 170bs, respectively (around the core shadow region of the chip 105) and a (front) supply (electric) circuit 170fp and a (back) supply (electric) circuit 170bp, respectively (in the core shadow region of the chip 105); the signal circuits 170fs, 170bs are (electrically) coupled with the signal circuit 135ms and the supply circuits 170fp, 170bp are (electrically) coupled with the conductive elements 160 (for example, by the use of through-vias). As above, the (signal/power) circuits 170fs, 170fp and the (signal/power) circuits 170bs, 170bp comprise one or more corresponding conductive layers of electrically conductive material (for example, copper), which extend parallel to the main plane of the circuitized substrate 125 (for example, again with a sandwiched structure formed by alternated conductive layers and insulating layers); the conductive layers are patterned into traces, with the traces in the different conductive layers that are connected among them by through-vias (crossing the insulating layers).

The signal circuit 170fs and the supply circuit 170fp expose contact elements of electrically conductive material (for example, lands of copper) on the front surface 125f, which are (electrically and mechanically) coupled (for example, by solder bumps) with the signal terminals 120s and with the supply terminals 120p, respectively (with a filler of electrically insulating material that fills a space between the die 115 and the circuitized substrate 125 to improve their mechanical connection and compensate their different thermal expansion coefficient); in this way, the supply circuit 170fp may compensate any difference in the arrangement of the supply terminals 120s and of the conductive elements 160. On the other hand, the signal circuit 170bs and the supply circuit 170bp expose contact elements of electrically conductive material (for example, lands of copper) on the back surface 125b, which are (electrically and mechanically) coupled with signal contacts 175s and with supply contacts 175*p*, respectively, of the electronic device 100 (for example, balls of electrically conductive material arranged in a grid when of the BGA (ball grid array) type); in this case as well, the supply circuit 170*bp* may compensate any difference in the arrangement of the supply contacts 175*s* and of the conductive elements 160. The whole assembly is generally embedded in a case of electrically insulating material that protects the chip 105 from the external environment, for example, by fastening a lid 180 onto the front surface 125*f* (around the chip 105).

Figure 2:
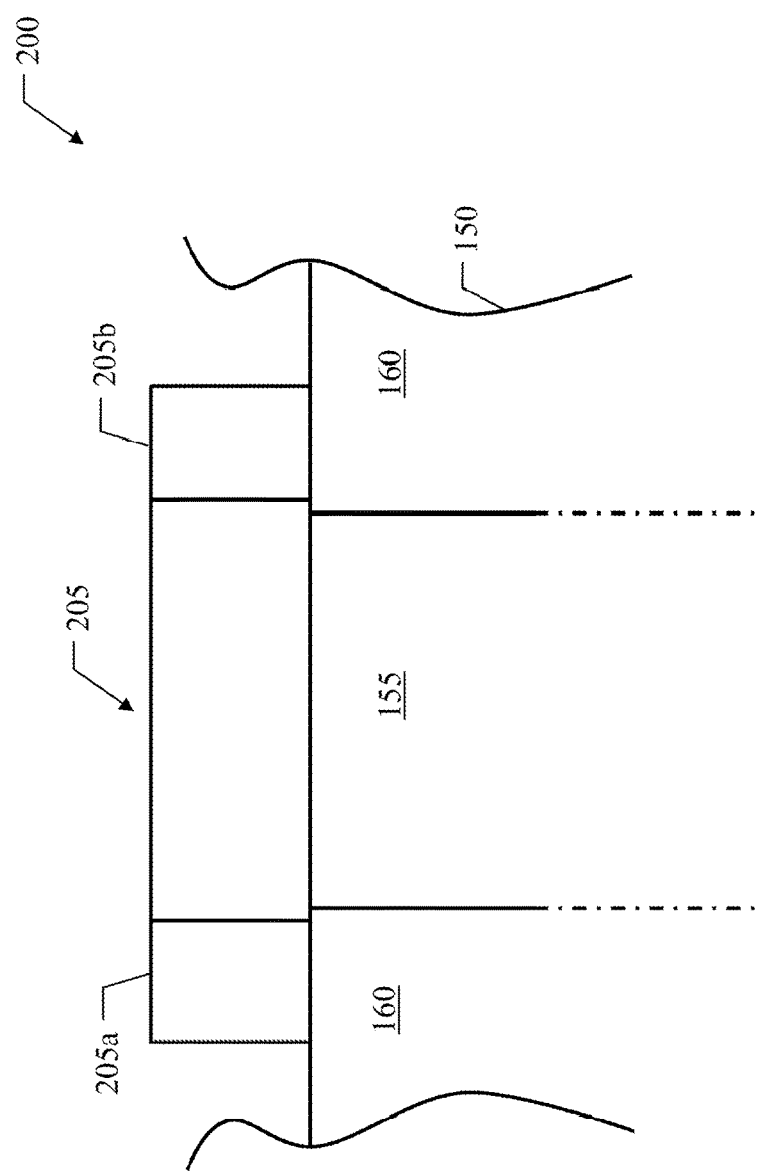
FIG. 2 shows a schematic representation in side view of an example of a supply insert of the electronic device according to an embodiment of the present disclosure.

With reference now to FIG. 2, a schematic representation in side view is shown of an example of a supply insert 200 of the electronic device according to an embodiment of the present disclosure.

The supply insert 200 comprises the above-described supply module 150 (with the conductive elements 160 separated by the insulating elements 155), to be inserted in the corresponding through-hole in the main portion of the circuitized substrate (not shown in the figure).

In an aspect according to an embodiment of the present disclosure, one or more auxiliary components of the integrated circuit of the chip (not shown in the figure) are mounted on the supply module 150; for example, these auxiliary components are (decoupling) capacitors 205 (only one shown in the figure), such as of MultiLayer Ceramics (MLC) type. As an example, each capacitor 205 bridges over an insulating element 155 (or more); more specifically, the capacitor 205 has a (first) terminal 205*a* and a (second) terminal 205*b*, which are (electrically and mechanically) coupled with a pair of (adjacent) conductive elements 160, separated by the insulating element 155.

In the above-described aspect, the capacitors 205 are provided outside the chip (so as to avoid the use of special technologies for their integration).

Nevertheless, the coupling of the capacitors 205 with the conductive elements 160 of the supply insert 200 avoids (or at least substantially mitigates) any bottleneck for the required current density.

Moreover, the capacitors 205 are arranged very close to the supply terminals of the chip; this provides good performance (since the corresponding connections have low line inductance and series resistance).

This aspect allows obtaining a relatively high density of the capacitors 205 and then a corresponding high capacitance (for example, up to several hundreds of μF), which provides a significant reduction in the variations of the power supply.

The same supply insert may be used for different types of chip; moreover, the supply insert may remain valid over time (for example, for several generations of the same chip), since the characteristics of the capacitors 205 are generally quite stable.

The above-described aspect is very flexible. Indeed, different capacitors 205 with different high-frequency characteristics, for example, either of a standard type or of a low Equivalent Series Resistance (ESR) type, may be combined in different ways to provide different frequency responses.

Figure 3:
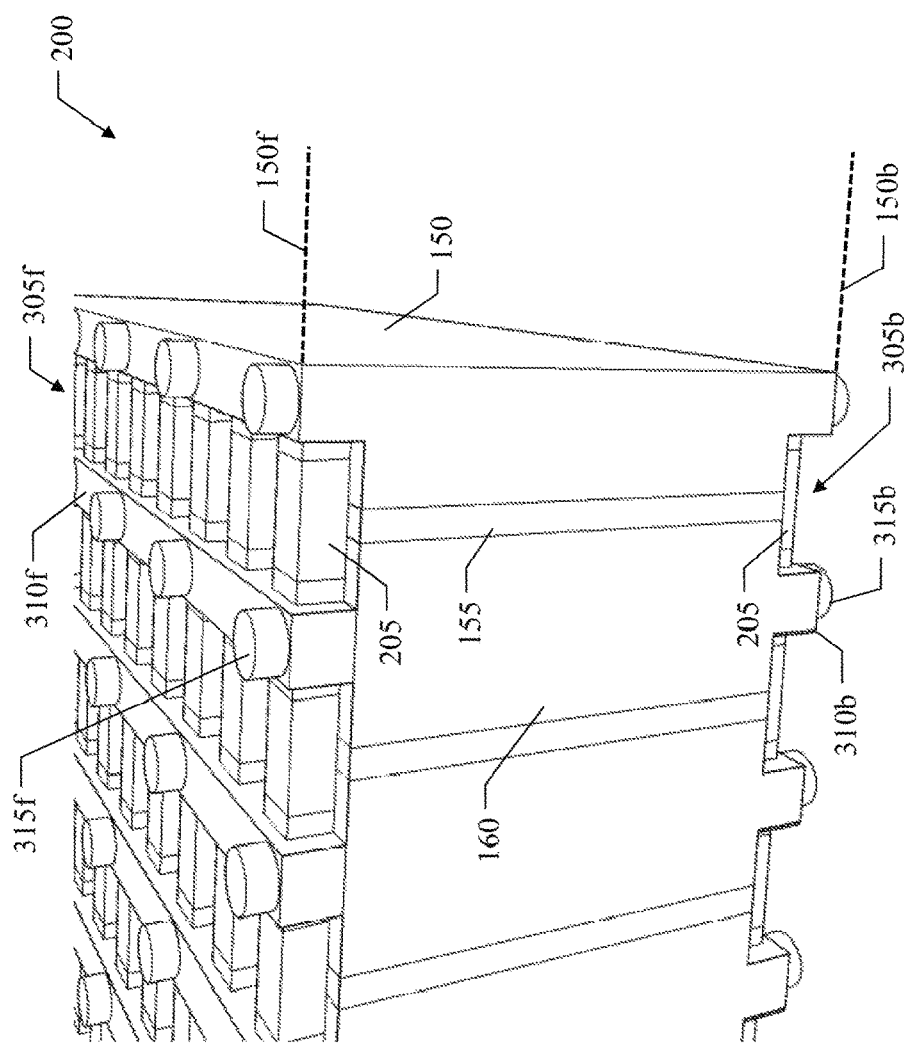
FIG. 3-FIG. 5 show an illustrative representation in perspective view of the supply insert according to different embodiments of the present disclosure.
Figure 4:
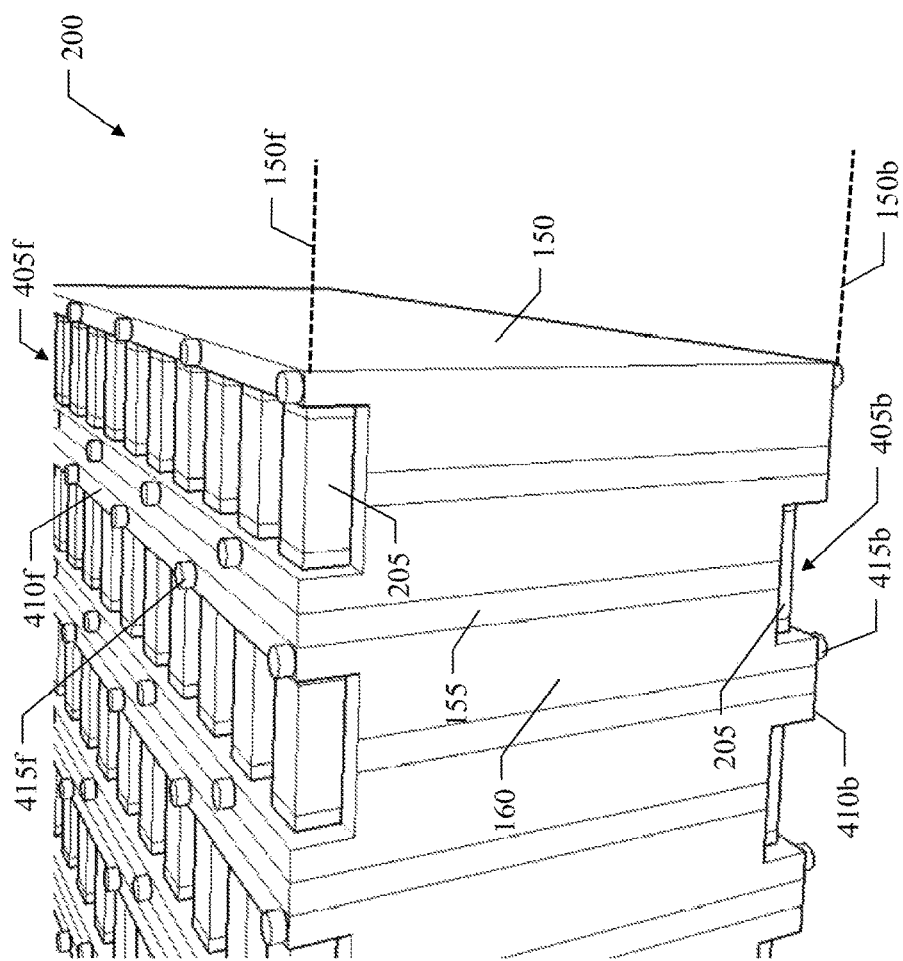
Figure 5:
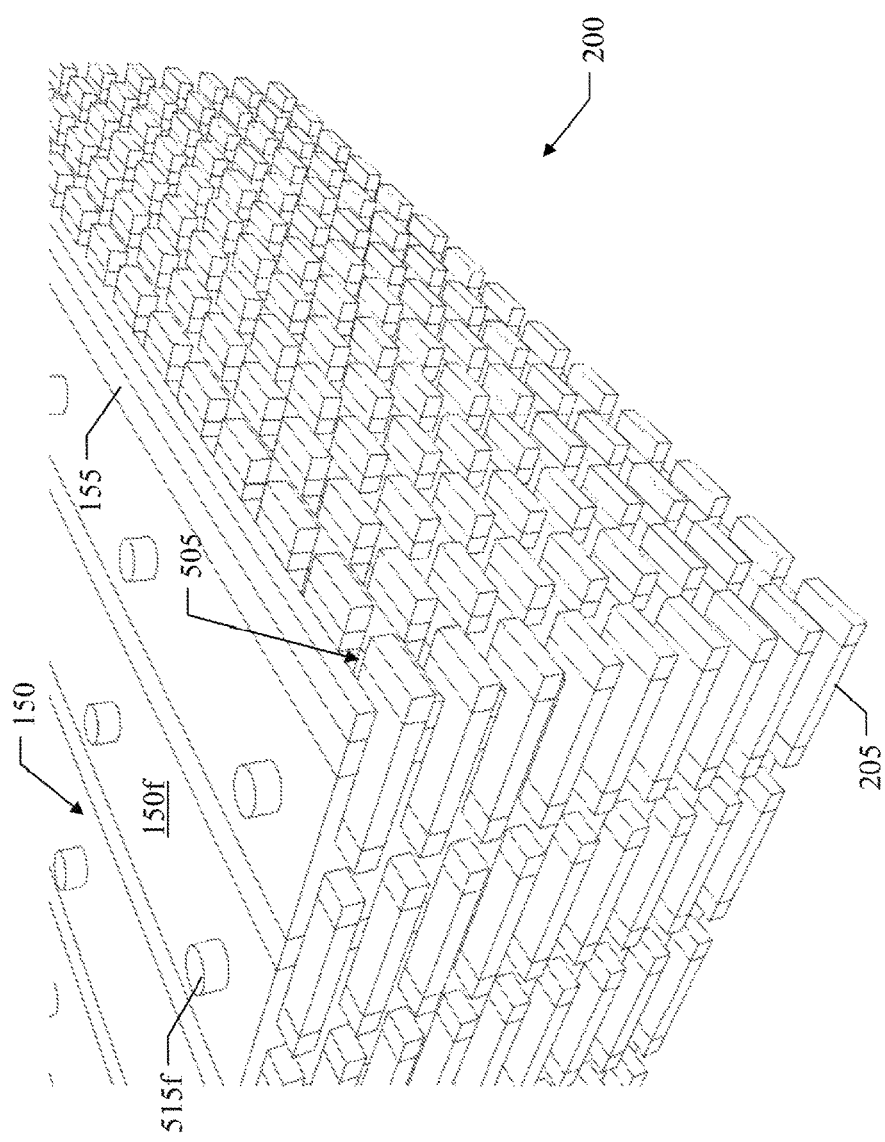

With reference now to FIG. 3-FIG. 5, an illustrative representation in perspective view is shown of the supply insert 200 according to different embodiments of the present disclosure.

In all these cases, recesses are formed in the supply module 150 for housing the capacitors 205. For example, each recess is formed along a corresponding insulating element 155; the recess extends within the adjacent conductive elements 160 that are separated by this insulating element 155.

For example, starting from FIG. 3, the recesses are channels that extend in the supply module 150 from one or more of its (end) surfaces that are reached by the insulating elements 155; for example, channels 305*f* are formed at the (hosting) front surface 150*f* and channels 305*b* are formed at the (hosting) back surface 150*b* of the supply module 150 (by corresponding grooves that cross the supply module 150 for its whole width). In this case, a channel 305*f* and a channel 305*b* is formed along each insulating element 155. As a result, a raised portion 310*f* of the front surface 150*f* is defined between each pair of adjacent channels 305*f* (and at the side of the first one and of the last one of the channels 305*f*) and a raised portion 310*b* of the back surface 150*b* is defined between each pair of adjacent channels 305*b* (and at the side of the first one and of the last one of the channels 305*b*), running along the rows of the supply terminals of the chip (not shown in the figure); in this case, the raised portions 310*f* and the raised portions 310*b* are aligned to each other, and all the raised portions 310*f*, 310*b* are free of the insulating elements 155. Several capacitors 205 are housed within each channel 305*f*, 305*b* (for example, distributed uniformly along it). Moreover, the front supply circuit and the back supply circuit (not shown in the figure) are coupled with the conductive elements 160 at the front surface 150*f* and at the back surface 150*b*, respectively, by through-vias 315*f* and by through-vias 315*b*, respectively, that contact the raised portions 310*f* and the raised portions 310*b*, respectively (for example, at several contact positions distributed uniformly along them).

In this way, assuming that the conductive elements 160 alternately receive the supply voltage (Vdd) and the ground voltage (GND), the capacitors 205 are connected in parallel to the corresponding supply terminals of the chip (not shown in the figure), so as to provide a total capacitance equal to the sum of their capacitances. The above-described configuration obtains a good density of the capacitors 205 that provides a good total capacitance, for example, of the order of 2×50-100 capacitors per cm2 (with capacitors 205 of 0.6 mm length, 0.3 mm width and 0.3 mm thickness); at the same time, the raised portions 310*f*, 310*b* (for example, with a width of 0.2-0.6 mm) provide a robust coupling with the conductive elements 160.

Moving to FIG. 4, as above the recesses are channels that extend in the supply module 150 from one or more of its (end) surfaces that are reached by the insulating elements 155, for example, channels 405*f* formed at the (hosting) front surface 150*f* and channels 405*b* formed at the (hosting) back surface 150*b* of the supply module 150. However, in this case the channels 405*f* and 405*b* are formed alternately along the insulating elements 160. As above, a raised portion 410*f* of the front surface 150*f* is defined between each pair of adjacent channels 405*f* (and at the side of the first one and of the last one of the channels 405*f*) and a raised portion 410*b* of the back surface 150*b* is defined between each pair of adjacent channels 405*b* (and at the side of the first one and of the last one of the channels 405*f*), running along the rows of the supply terminals of the chip (not shown in the figure); in this case, the raised portions 410*f* and the raised portions 410*b* are staggered to each other, and each raised portion 410*f*, 410*b* (apart from the first ones and the last ones) has an insulating element 155 that extends from it. As above, several capacitors 205 are housed within each channel 405*f*, 405*b* (for example, distributed uniformly along it). Moreover, the front supply circuit and the back supply circuit (not shown in the figure) are coupled with the conductive elements 160 at the front surface 150*f* and at the back surface 150*b*, respectively, by through-vias 415*f* and by through-vias 415b, respectively, that contact the raised portions 410f and the raised portions 410b, respectively; however, in this case, the through-vias 415f, 415b along each raised portion 410f, 410b contact each one of the corresponding adjacent conductive elements 160 at several contact positions (for example, distributed uniformly along them) that are staggered to each other; this avoids (or at least significantly reduces) any risk of interference among the through-vias 415f, 415b of adjacent conductive elements 160.

As above, the capacitors 205 are connected in parallel to the corresponding supply terminals of the chip (not shown in the figure), so as to provide a total capacitance equal to the sum of their capacitances. The above-described configuration obtains a high density of the capacitors 205 that provides a high total capacitance, for example, of the order of 2×150-250 capacitors (as above) per cm2.

Moving to FIG. 5, in this case the recesses are through-holes 505 that cross the supply module 150 (shown in partially cut away view in the figure); for example, several through-holes 505 are formed along each insulating element 155. As above, several capacitors 205 are housed within each through-hole 505 (for example, distributed uniformly along it). Moreover, the front supply circuit and the back supply circuit (not shown in the figure) are coupled with the conductive elements at the front surface and at the back surface by respective through-vias that contact them, only visible at the front surface 150f and denoted with the reference 515f in the figure (for example, at several contact positions distributed uniformly along them).

As above, the capacitors 205 are connected in parallel to the corresponding supply terminals of the chip (not shown in the figure), so as to provide a total capacitance equal to the sum of their capacitances. The above-described configuration obtains a very high density of the capacitors 205 that provides a very high total capacitance, for example, of the order of 500-1.000 capacitors (as above) per cm2; at the same time, the coupling with the (whole) conductive elements (for example, with a width of 0.5-1.5 mm) is very robust.

Figure 6:
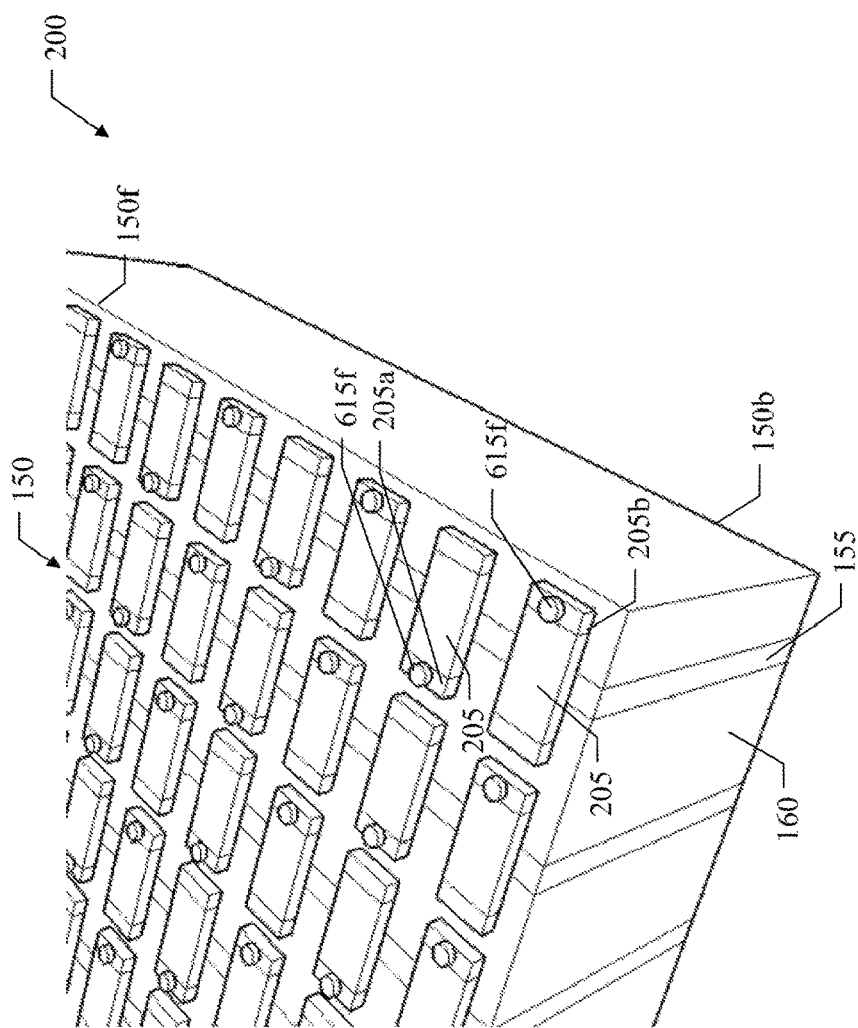
FIG. 6 shows an illustrative representation in perspective view of the supply insert according to an embodiment of the present disclosure.

With reference now to FIG. 6, an illustrative representation in perspective view is shown of the supply insert 200 according to an embodiment of the present disclosure.

In this case, the capacitors 205 are mounted directly on one or more of the (end) surfaces of the supply module 150 that are reached by the insulating elements 155; for example, several capacitors 205 are mounted along each insulating element 155 (for example, distributed uniformly along it) on the (hosting) front surface 150f and on the (hosting) back surface 150b (only visible for the front surface 150f in the figure). Moreover, the front supply circuit and the back supply circuit (not shown in the figure) are coupled with the conductive elements 160 at the front surface 150f and at the back surface 105b by respective through-vias that reach the corresponding terminals 205a, 205b of the capacitors 205 (for example, plated with copper), only visible for the front surface 150f and denoted with the reference 615f in the figure; e.g., the through-vias 615f along the capacitors 205 of each insulating element 155 are coupled alternately with the (first) terminals 205a and with the (second) terminals 205b of the capacitors 205, so as to be staggered to each other; this avoids (or at least significantly reduces) any risk of interference among the through-vias 615f connected to the corresponding adjacent conductive elements 160.

As above, the capacitors 205 are connected in parallel to the corresponding supply terminals of the chip (not shown in the figure), so as to provide a total capacitance equal to the sum of their capacitances. The above-described configuration obtains a very high density of the capacitors 205, which provides a very high total capacitance, for example, of the order of 200-400 capacitors (as above) per cm2.

With reference now to FIG. 7A-FIG. 7D, phases are shown of a process for manufacturing the supply insert according to an embodiment of the present disclosure.

For the sake of simplicity, in the following reference will be made to a single supply insert. However, in general the manufacturing is performed at the level of a batch of identical supply inserts that are formed simultaneously in a large plate and then sawed, milled and polished.

Figure 7B:
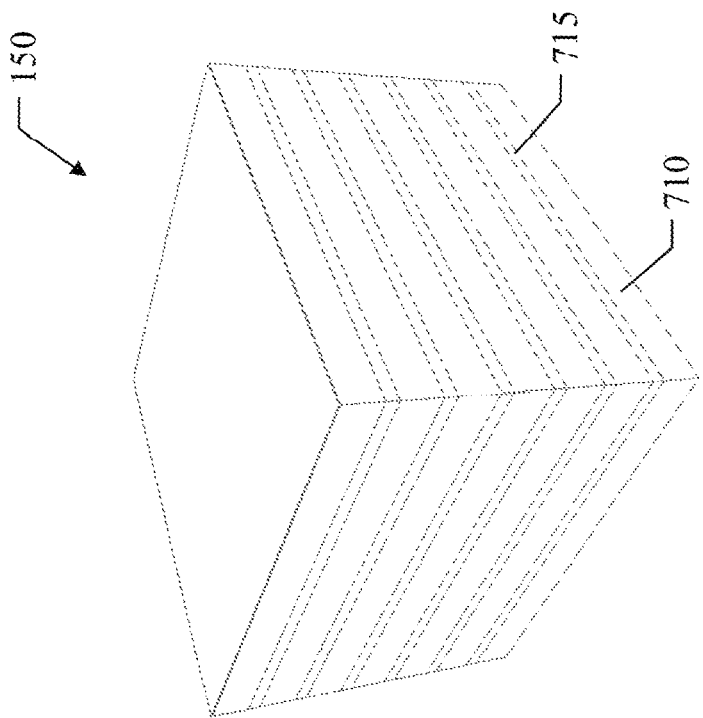
Figure 7A:
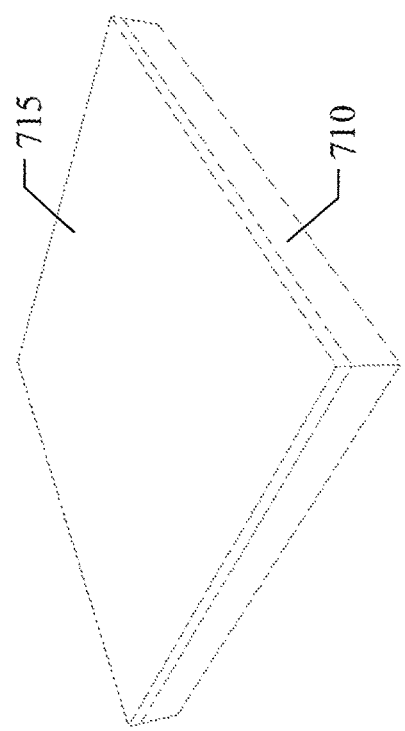

Starting from FIG. 7A, a conductive layer 710 of the same material of the conductive elements of the supply module is provided (for example, with a thickness of 0.3-2.0 mm). An insulating layer 715 of the same material of the insulating elements of the supply insert (for example, pre-impregnated with epoxy resin) is laminated onto the conductive layer 710.

Moving to FIG. 7B, the same operation is repeated as many times as required so as to obtain a composite panel with a sandwiched structure formed by alternated conductive layers 710 and insulating layers 715 (for example, 20-40 conductive/insulating layers 710, 715 starting and ending with conductive layers 710); the conductive layers 710 may have the same thickness (as shown in the figure) or different thicknesses, combined in any way according to contingent needs. This composite panel (once turned horizontally by 90°) directly defines the supply module 150 without any recess for mounting the capacitors (not shown in the figure) on its front surface and back surface, so as to obtain the supply insert of FIG. 6. For example, for this purpose the capacitors are attached to the corresponding conductive elements by using an attaching media providing both electrical and mechanical connection, such as a sintering paste based on copper or any other suitable alloy; the sintering paste (once sintered) maintains its properties and remains in the solid state even if subject to relatively high temperatures (for example, up to 400-500° C.). This prevents any dangerous melting of the sintering paste during the next thermal cycles that are typically performed for manufacturing the electronic device. The capacitors and the sintering paste are then covered by a filler of electrically insulating (but possibly thermally conductive) material, which improves the mechanical connections and compensate any thermal expansion mismatch.

Moving to FIG. 7C, as an alternative the composite panel is milled and/or drilled along each insulating layer 715 at its (vertical) surfaces (perpendicular to the conductive/insulating layers 710, 715). This composite panel (once turned horizontally by) 90° then defines the supply module 150 with the channels 305f, 305b formed by the milling/drilling for mounting the capacitors (not shown in the figure) within them as above, so as to obtain the supply insert of FIG. 3.

Moving to FIG. 7D, as a further alternative the composite panel is milled and/or drilled along the insulating layers 715 alternately at its vertical surfaces. This composite panel (once turned horizontally by 90°) then defines the supply module 150 with the channels 405f, 405b formed by the milling/drilling for mounting the capacitors (not shown in the figure) within them as above, so as to obtain the supply insert of FIG. 4.

Figure 8:
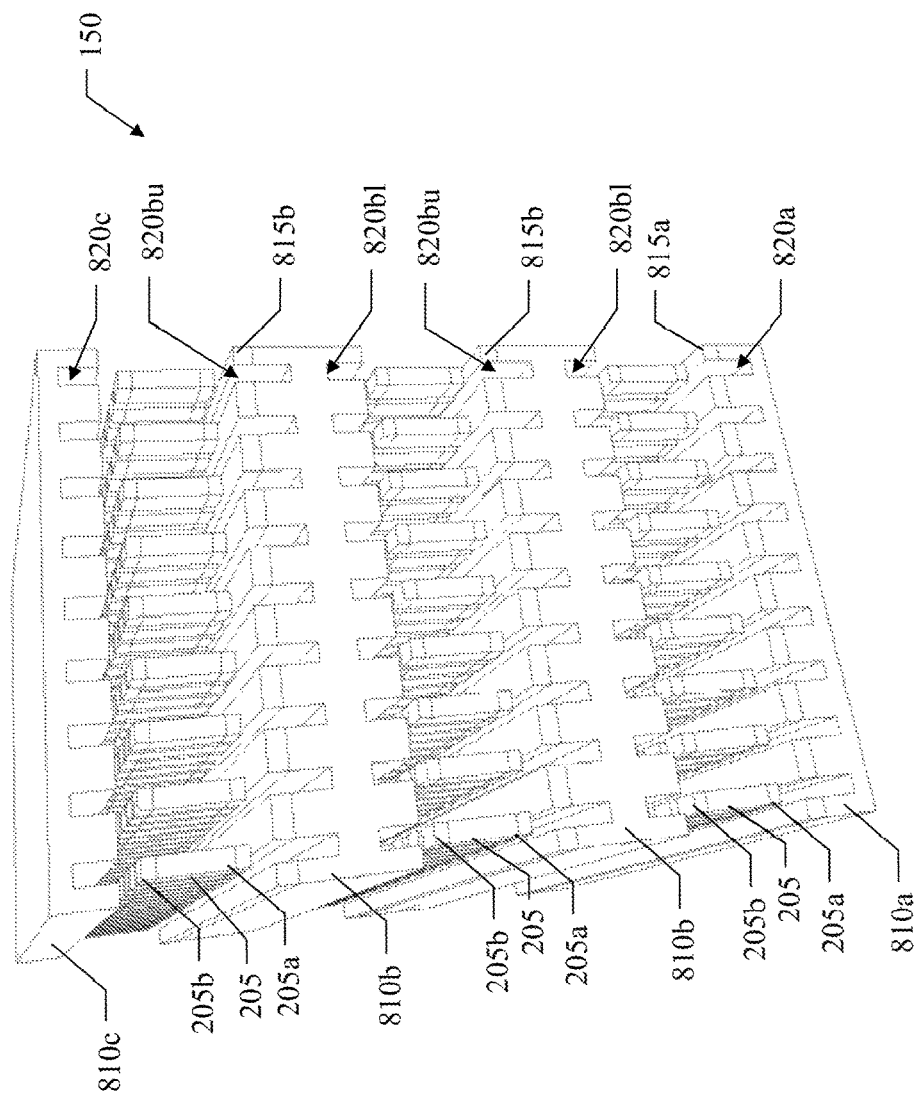
FIG. 8 shows phases of a process for manufacturing the supply insert according to an embodiment of the present disclosure.

With reference now to FIG. 8, phases are shown of a process for manufacturing the supply insert according to an embodiment of the present disclosure.

For example, the process is used to manufacture the supply insert 150 of FIG. 5 (shown in exploded view in the figure). For this purpose, as above a conductive layer 810a is provided and an insulating layer 815*a* is laminated onto the conductive layer 810*a*. A composite panel formed by the conductive layer 810*a* and the insulating layer 815*a* is drilled and/or milled at a free surface of the insulating layer 815*a* to form channels 820*a* that extend downwards into the conductive layer 810*a*. Corresponding capacitors 205 are then mounted (in vertical) within the channels 820*a* (by only attaching their terminals 205*a* to the conductive layer 810*a* as above, whereas their terminals 205*b* are left free projecting outside the channels 820*a*).

Again, a conductive layer 810*b* is provided and an insulating layer 815*b* is laminated onto the conductive layer 810*b*. A composite panel formed by the conductive layer 810*b* and the insulating layer 815*b* is milled and/or drilled at a free surface of the conductive layer 810*b* and at a free surface of the insulating layer 815*b* to form channels 820*bl* and 820*bu*, respectively that extend upwards and downwards, respectively, into the conductive layer 810*b*. The composite panel 810*b*, 815*b* is laminated onto the composite panel 810*a*, 815*a*. At the same time, the capacitors 205 already mounted within the channels 820*a* are further mounted within the channels 820*bl* (by attaching their terminals 205*b* to the conductive layer 810*b* as above); in this way, each pair of opposite channels 820*a* and 820*bl* forms the corresponding through-hole housing these capacitors 205. Further corresponding capacitors 205 are then mounted (in vertical) within the channels 820*bu* (by only attaching their terminals 205*a* to the conductive layer 810*b* as above, whereas their terminals 205*b* are left free projecting outside the channels 820*bu*). The same operations are repeated as many times as required.

At the end, again a conductive layer 810*c* is provided. The conductive layer 810*c* is milled and/or drilled at a (lower) free surface thereof to form channels 820*c* that extend upwards into the conductive layer 810*c*. The conductive layer 810*c* is laminated onto the composite panel 810*b*, 815*b*. At the same time, the capacitors 205 already mounted within the channels 820*bu* are further mounted within the channels 820*c* (by attaching their terminals 205*b* to the conductive layer 810*c* as above); in this way, each pair of opposite channels 820*bu* and 820*c* forms the corresponding through-hole housing these capacitors 205. As a result, the supply insert of FIG. 5, already with the capacitors 205 mounted within its through-holes, is obtained (once turned horizontally by 90°).

The above-described operations may also be performed in parallel (at least partially). For example, a pre-processed component formed by the composite panel 810*a*, 815*a* with the channels 820*a*, one or more pre-processed components each one formed by the composite panel 810*b*, 815*b* with the channels 820*b*1, 820*bu* and a pre-processed component formed by the conductive layer 810*c* with the channels 820*c* may be provided, with the corresponding capacitors 205 already mounted in the channels of a pre-processed component of each pair of adjacent pre-processed components. These pre-processed components may then be laminated in a single operation to obtain the same supply insert as above.

Naturally, in order to satisfy local and specific requirements, a person skilled in the art may apply many logical and/or physical modifications and alterations to the aspects of the present disclosure. More specifically, although aspects of this disclosure have been described with a certain degree of particularity with reference to one or more embodiments thereof, it should be understood that various omissions, substitutions and changes in the form and details as well as other embodiments are possible. For example, different embodiments of aspects of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

One or more aspects of the present disclosure are based on the idea of mounting auxiliary components on a transversal portion of a circuitized substrate.

One aspect provides a circuitized substrate for mounting at least one electronic component, wherein one or more auxiliary components of the electronic component are mounted on a portion of electrically conductive material having one or more insulating elements of electrical insulating material crossing it transversally to a plane of the circuitized substrate to insulate a plurality of conductive elements thereof.

A further aspect provides a corresponding insert for use in the circuitized substrate.

A further aspect provides an electronic device comprising the circuitized substrate.

A further aspect provides a method for manufacturing the circuitized substrate.

In one example, an embodiment provides a circuitized substrate for mounting at least one electronic component having a plurality of terminals. However, the circuitized substrate may be of any type (for example, a PCB); the circuitized substrate may be used to mount any number and type of electronic components (for example, discrete elements) with any number and type of terminals (for example, pins).

In an embodiment, the circuitized substrate comprises a first portion of electrical insulating material. However, the first portion may be of any type (for example, integral) and of any material (for example, thermosetting resin).

In an embodiment, the first portion embeds a first electric circuit for coupling a first subset of the terminals. However, the first electric circuit may be of any type (for example, with tracks, bars or any combination thereof); the terminals of the first subset may be in any number, at any position (for example, arranged laterally) and of any type (for example, for receiving the power supply as well).

In an embodiment, the first electric circuit comprises one or more patterned conductive layers of electrically conductive material extending parallel to a plane of the circuitized substrate. However, the conductive layers may be in any number, of any material (for example, aluminum) and with any topology (with or without through-vias).

In an embodiment, the circuitized substrate comprises a second portion of electrically conductive material. However, the second portion may be of any type (for example, formed by two or more bodies) and of any material (for example, aluminum).

In an embodiment, one or more insulating elements of electrical insulating material cross the second portion transversally to said plane to insulate a plurality of conductive elements thereof for coupling a second subset of the terminals. However, the insulating elements may be in any number and of any material (either the same or different from above) and they may cross the second portion transversally in any way (for example, obliquely by forming any non-null angle with said plane, such as 80°-100°, in particular 85°-95° and more particularly 87°-93°, such as 90°) to define any number and type of conductive elements (for example, extending along a non-linear curve); the terminals of the second subset may be in any number, at any position (for example, arranged laterally) and of any type (for example, for exchanging signals in addition or in alternative to receiving the power supply).

In an embodiment, the circuitized substrate comprises one or more auxiliary components of the electronic component mounted on the second portion. However, the auxiliary components may be in any number and of any type (for example, resistors, inductors, voltage regulators).

In an embodiment, each auxiliary component has a first terminal and a second terminal coupled with a first one and a second one, respectively, of a pair of the conductive elements. However, the first and second terminals may be of any type (for example, pins) and they may be coupled in any way (for example, glued) with any pair of conductive elements (for example, conductive elements that are not adjacent to each other since separated by two or more conductive elements).

In an embodiment, the terminals of the first subset are signal terminals for exchanging signals with the electronic component and the terminals of the second subset are supply terminals for supplying the electronic component. However, the signal terminals and the supply terminals may be of any type (for example, for exchanging logic or analogic signals and for receiving main or I/O supply voltages, respectively).

In an embodiment, the first portion comprises a plurality of insulating layers of electrical insulating material alternated with the conductive layers. However, the insulating/conductive layers may be in any number and of any size.

In an embodiment, in the second portion the conductive elements and the insulating elements comprise further conductive layers and further insulating layers, respectively, alternated to each other. However, the further insulating/conductive layers may be in any number and of any size.

In an embodiment, the second portion has one or more recesses each one housing one or more of the auxiliary components. However, the recesses may be in any number each one for housing any number of auxiliary components (totally or only in part), or they may be omitted.

In an embodiment, each recess extends along the corresponding insulating element within the first conductive element and the second conductive element of the corresponding pair. However, the recess may have any extent (for example, only running along a part of the corresponding insulating element).

In an embodiment, the second portion has a plurality of second end surfaces; at least part of the recesses are channels extending in the second portion from at least one hosting surface of the second end surfaces (so that in each hosting surface each pair of adjacent ones of the channels defines a raised portion of the hosting surface). However, the hosting surfaces may be in any number, at any position (for example, laterally) and with any number of channels (for all the recesses or only part thereof); in each hosting surface, the channels may be in any number and arranged in any way to define the corresponding raised portions.

In an embodiment, the raised portions are free of the insulating elements. However, the raised portions may be free of the insulating elements in any way (for example, because covered by an additional insulating layer).

In an embodiment, at least one of the insulating elements extends from each raised portion. However, the insulating elements extending from each raised portion may be in any number and of any type (for example, only running along a part thereof).

In any case, any combination of raised portions with and without insulating elements is possible.

In an embodiment, for each raised portion a further first one and a further second one of the conductive elements extend from the raised portion at opposite sides of the corresponding insulating element; the further first conductive element is contacted at a plurality of first contact positions for coupling with corresponding terminals of the second subset and the further second conductive element is contacted at a plurality of second contact positions for coupling with corresponding terminals of the second subset. However, the contact positions may be in any number and for any type of contact elements (for example, solder balls), either for coupling the conductive elements with the corresponding terminals directly or through the corresponding electric circuit.

In an embodiment, the first contact positions and the second contact positions are staggered to each other. However, the contact positions may be staggered in any way (for example, only partially). In any case, the contact positions may be staggered in any other embodiment, they may always be aligned or they may be arranged in any combination thereof.

In an embodiment, the hosting surfaces comprise a first hosting surface and a second hosting surface opposite to each other. However, the pair of opposite hosting surfaces may be in any number.

In an embodiment, the raised portions of the first hosting surface and the raised portions of the second hosting surface are staggered to each other. However, these raised portions may be staggered in any way (either uniformly or not) or more generally they may be arranged in any other way (always staggered, always aligned or in any combination thereof).

In an embodiment, at least part of the recesses are holes crossing the second portion at least partially. However, the holes may be in any number (for all the recesses or only part thereof) and arranged in any way (either uniformly or not); moreover, the holes may be of any type (for example, only through-holes, only blind holes or any combination thereof).

In an embodiment, the second portion has a plurality of second end surfaces; at least part of the auxiliary components are mounted on at least a hosting surface of the second end surfaces. However, the auxiliary components may be mounted in any number on any number of surfaces (totally or only in part), or they may be mounted always in corresponding recesses.

In an embodiment, for each pair of first conductive element and second conductive element extending from each hosting surface the first terminals and the second terminals of the corresponding auxiliary components are contacted alternately for coupling the first conductive element and second conductive element, respectively, with corresponding terminals of the second subset. However, the contacts may be in any number and of any type (either the same or different from above); moreover, the contacts may be alternated in any way (for example, by skipping one or more auxiliary components). In any case, the contacts may be with the terminals of the auxiliary components (either alternated or not) in any other embodiment, they may always be with the conductive elements directly or they may be in any combination thereof.

In an embodiment, the first portion extends between a first end surface and a further first end surface parallel to said plane and it has at least one through hole crossing the first portion from the first end surface to the further first end surface; the second portion is inserted in the through-hole. However, the through holes (and then the second portions) may be in any number, of any size, and at any position; moreover, the second portion may be arranged within the through hole in any way (for example, sunk in and/or protruding from the first portion at one or both of its end surfaces).

In an embodiment, the circuitized substrate comprises an external portion of electrical insulating material covering the first end surface and the second portion. However, the external portion may be provided at the first end surface only, at both the first end surface and the further first end surface, or it may be omitted.

In an embodiment, the external portion comprises a further first electric circuit for coupling the terminals of the first subset with the first electric circuit and a second electric circuit for coupling the terminals of the second subset with the conductive elements. However, the further first electric circuit and the second electric circuit may be of any type (either the same or different with respect to each other and to the first electric circuit).

In an embodiment, the further first electric circuit and the second electric circuit comprise one or more further patterned conductive layers of electrical conducting material extending parallel to said plane. However, the further conductive layers may be in any number, of any material and with any topology (either the same or different from above).

In an embodiment, the auxiliary components are decoupling capacitors. However, the capacitors may be of any type (for example, small, big, narrow, large) and in any combinations.

In an embodiment, the circuitized substrate is a chip carrier and said at least one electronic component is a monolithic chip. However, the chip carrier may be of any type (for example, for high-frequency applications) and the chip may be of any type (for example, implementing a flash memory).

An embodiment provides an insert for use in the above-mentioned circuitized substrate; the insert comprises said second portion and said auxiliary components mounted on the second portion. However, the insert may be provided with different, additional or alternative features (for example, with any empty spaces filled with a filler, such as epoxy resin, to consolidate it), either as a stand-alone product or already embedded in the circuitized substrate.

An embodiment provides an electronic device comprising the above-mentioned circuitized substrate and said at least one electronic component mounted on the circuitized substrate. However, the electronic device may be of any type (for example, embedded in a plastic package, with a dual-side cooling system); the electronic device may be used stand-alone, in intermediate products (such as motherboards) or in complex systems (such as computers).

In an embodiment, the electronic device is of the flip-chip type. However, the electronic device may be of any type (for example, of wire-bonding type).

Generally, similar considerations apply if the circuitized substrate, the insert and the electronic device each one has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

An embodiment provides a method for manufacturing a circuitized substrate for mounting at least one electronic component having a plurality of terminals, the method comprising: providing a first portion of electrical insulating material embedding a first electric circuit for coupling a first subset of the terminals, the first electric circuit comprising one or more patterned conductive layers of electrically conductive material extending parallel to a plane of the circuitized substrate, providing a second portion of electrically conductive material, one or more insulating elements of electrical insulating material crossing the second portion to insulate a plurality of conductive elements thereof for coupling a second subset of the terminals, with one or more auxiliary components of the electronic component mounted on the second portion, each auxiliary component having a first terminal and a second terminal coupled with a first one and a second one, respectively, of a pair of the conductive elements, and adding the second portion to the first portion to have the insulating elements extending transversally to said plane.

However, either the whole circuitized substrate or the insert alone (for insertion into the first portion of the circuitized substrate) may be manufactured in any way (for example, by depositing the insulating layers onto the conductive layers).

Generally, similar considerations apply if the same aspect is implemented with an equivalent method (by using similar steps with the same functions of more steps or portions thereof, removing some steps being non-essential, or adding further optional steps); moreover, the steps may be performed in a different order, concurrently or in an interleaved way (at least in part).

The above-described features may be combined in any way.

What is claimed is:

1. A circuitized substrate for mounting at least one electronic component having a plurality of terminals, the circuitized substrate comprising:
   a first portion of electrical insulating material embedding a first electric circuit for coupling a first subset of terminals, the first electric circuit comprising one or more patterned conductive layers of electrically conductive material extending parallel to a plane of the circuitized substrate;
   a second portion of electrically conductive material, wherein one or more insulating elements of electrical insulating material cross the second portion transversally to said plane to insulate a plurality of conductive elements thereof for coupling a second subset of terminals, and wherein the first portion extends between a first end surface and a further first end surface parallel to said plane and has at least one through hole crossing the first portion from the first end surface to the further first end surface, the second portion being inserted in the through hole; and one or more auxiliary components of an electronic component mounted on the second portion, an auxiliary component having a first terminal and a second terminal coupled with a first conductive element and a second conductive element, respectively, of a pair of conductive elements of the plurality of conductive elements.

2. The circuitized substrate according to claim 1, wherein the terminals of the first subset are signal terminals for exchanging signals with the electronic component and the terminals of the second subset are supply terminals for supplying power to the electronic component.

3. The circuitized substrate according to claim 1, wherein the first portion comprises a plurality of insulating layers of electrical insulating material alternated with the one or more patterned conductive layers, and wherein in the second portion the plurality of conductive elements and the one or more insulating elements comprise further conductive layers and further insulating layers, respectively, alternated to each other.

4. The circuitized substrate according to claim 1, wherein the second portion has one or more recesses, and wherein a recess houses at least one auxiliary component of the one or more the-auxiliary components, the recess extending along a corresponding insulating element within the first conductive element and the second conductive element of a corresponding pair of conductive elements.

5. The circuitized substrate according to claim 4, wherein the second portion has a plurality of second end surfaces, at least part of the one or more recesses being channels extending in the second portion from at least a hosting surface of the plurality of second end surfaces, wherein in the hosting surface a pair of adjacent ones of the channels define a raised portion of the hosting surface.

6. The circuitized substrate according to claim 5, wherein the raised portion is free of insulating elements.

7. The circuitized substrate according to claim 5, wherein at least one insulating element extends from the raised portion.

8. The circuitized substrate according to claim 7, wherein for the raised portion a further first conductive element and a further second conductive element of the plurality of conductive elements extend from the raised portion at opposite sides of the corresponding insulating element, the further first conductive element being contacted at a plurality of first contact positions for coupling with corresponding terminals of the second subset and the further second conductive element being contacted at a plurality of second contact positions for coupling with corresponding terminals of the second subset of terminals, the first contact positions and the second contact positions being staggered to each other.

9. The circuitized substrate according to claim 1, wherein the hosting surface comprises a first hosting surface and a second hosting surface opposite to each other, and wherein raised portions of the first hosting surface and raised portions of the second hosting surface are staggered to each other.

10. The circuitized substrate according to claim 4, wherein at least part of the one or more recesses are holes crossing the second portion at least partially.

11. The circuitized substrate according to claim 1, wherein the second portion has a plurality of second end surfaces, and wherein at least part of the one or more auxiliary components are mounted on at least a hosting surface of the plurality of second end surfaces.

12. The circuitized substrate according to claim 11, wherein for a pair of first conductive element and second conductive element extending from a hosting surface, first terminals and second terminals of corresponding auxiliary components are contacted alternately for coupling the first conductive element and the second conductive element, respectively, with corresponding terminals of the second subset of terminals.

13. The circuitized substrate according to claim 1, further comprising an external portion of electrical insulating material covering the first end surface and the second portion and comprising a further first electric circuit for coupling the terminals of the first subset of terminals with the first electric circuit and a second electric circuit for coupling the terminals of the second subset of terminals with the plurality of conductive elements, the further first electric circuit, and the second electric circuit comprising one or more further patterned conductive layers of electrical conducting material extending parallel to said plane.

14. The circuitized substrate according to claim 1, wherein the one or more auxiliary components are decoupling capacitors.

15. The circuitized substrate according to claim 1, wherein the circuitized substrate is a chip carrier and the at least one electronic component is a monolithic chip.

16. An electronic device comprising:
a circuitized substrate for mounting at least one electronic component, the circuitized substrate comprising:
a first portion of electrical insulating material embedding a first electric circuit for coupling a first subset of terminals, the first electric circuit comprising one or more patterned conductive layers of electrically conductive material extending parallel to a plane of the circuitized substrate;
a second portion of electrically conductive material, wherein one or more insulating elements of electrical insulating material cross the second portion transversally to said plane to insulate a plurality of conductive elements thereof for coupling a second subset of terminals, and wherein the first portion extends between a first end surface and a further first end surface parallel to said plane and has at least one through hole crossing the first portion from the first end surface to the further first end surface, the second portion being inserted in the through hole; and
one or more auxiliary components of an electronic component mounted on the second portion, an auxiliary component having a first terminal and a second terminal coupled with a first conductive element and a second conductive element, respectively, of a pair of the conductive elements of the plurality of conductive elements; and
at least one electronic component mounted on the circuitized substrate.

17. The electronic device according to claim 16, wherein the circuitized substrate is a chip carrier and the at least one electronic component is a monolithic chip, and wherein the electronic device is of the flip-chip type.

18. The electronic device of claim 16, wherein the second portion has one or more recesses, and wherein a recess houses at least one auxiliary component of the one or more auxiliary components, the recess extending along a corresponding insulating element within the first conductive element and the second conductive element of a corresponding pair of conductive elements, and wherein the second portion has a plurality of second end surfaces, at least part of the one or more recesses being channels extending in the second portion from at least a hosting surface of the plurality of second end surfaces, wherein in the hosting surface a pair of adjacent ones of the channels define a raised portion of the hosting surface.

19. A method of manufacturing a circuitized substrate for mounting at least one electronic component having a plurality of terminals, the method comprising:
    providing a first portion of electrical insulating material embedding a first electric circuit for coupling a first subset of terminals, the first electric circuit comprising one or more patterned conductive layers of electrically conductive material extending parallel to a plane of the circuitized substrate;
    providing a second portion of electrically conductive material, wherein one or more insulating elements of electrical insulating material cross the second portion to insulate a plurality of conductive elements thereof for coupling a second subset of terminals, with one or more auxiliary components of an electronic component mounted on the second portion, an auxiliary component having a first terminal and a second terminal coupled with a first conductive element and a second conductive element, respectively, of a pair of conductive elements of the plurality of conductive elements, and wherein the first portion extends between a first end surface and a further first end surface parallel to said plane and has at least one through hole crossing the first portion from the first end surface to the further first end surface, the second portion being inserted in the through hole; and
    adding the second portion to the first portion to have the insulating elements extend transversally to said plane.

20. The method of claim 19, wherein the circuitized substrate is a chip carrier and the at least one electronic component is a monolithic chip.

* * * * *